(12) United States Patent
Park et al.

(10) Patent No.: US 11,574,769 B2
(45) Date of Patent: Feb. 7, 2023

(54) BRACE APPARATUS FOR TRANSFORMER TANK AND METHOD FOR DETERMINING LENGTH THEREOF

(71) Applicant: HYOSUNG HEAVY INDUSTRIES CORPORATION, Seoul (KR)

(72) Inventors: Chui Jun Park, Busan (KR); Kyo Ho Lee, Gimhae-si (KR); Do Jin Kim, Changwon-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 823 days.

(21) Appl. No.: 16/473,742

(22) PCT Filed: Dec. 5, 2017

(86) PCT No.: PCT/KR2017/014164
§ 371 (c)(1),
(2) Date: Jun. 26, 2019

(87) PCT Pub. No.: WO2018/124520
PCT Pub. Date: Jul. 5, 2018

(65) Prior Publication Data
US 2021/0125777 A1    Apr. 29, 2021

(30) Foreign Application Priority Data
Dec. 30, 2016    (KR) .................. 10-2016-0184327

(51) Int. Cl.
*F16F 15/02*    (2006.01)
*H01F 27/33*    (2006.01)
(Continued)

(52) U.S. Cl.
CPC .............. *H01F 27/33* (2013.01); *F16F 15/02* (2013.01); *G10K 11/172* (2013.01); *H01F 27/02* (2013.01); *H01F 27/06* (2013.01)

(58) Field of Classification Search
CPC .......... H01F 27/33; H01F 27/02; H01F 27/06; F16F 15/02; G10K 11/172; G10K 11/16; H05K 5/00; H05K 5/0056
See application file for complete search history.

(56) References Cited

U.S. PATENT DOCUMENTS 3,260,974 A * 7/1966 Specht .................... H01F 27/33
174/15.1
3,270,305 A * 8/1966 Glassanos ............. H01F 37/005
336/84 R
(Continued)

FOREIGN PATENT DOCUMENTS

| JP | 2006203088 A | 8/2006 |
| JP | 2013-021035 A | 1/2013 |

(Continued)

*Primary Examiner* — Mang Tin Bik Lian
(74) *Attorney, Agent, or Firm* — Novick, Kim & Lee PLLC; Jae Youn Kim

(57) ABSTRACT

Provided is a brace apparatus for a transformer tank and a method for determining the length thereof. The brace apparatus is mounted on a transformer tank so as to reinforce the transformer tank. The brace apparatus has a brace main body forming the exterior thereof, and in order to block the occurrence of resonance in an inner space of the brace main body, the length of the brace main body is set to be at a value at which resonance does not occur in the inner space, or a partition plate is provided to the brace main body so as to block the occurrence of resonance. In present invention, the length of the brace apparatus may be set by means of a simple configuration, thereby enabling the prevention of noise from occurring due to resonance.

2 Claims, 7 Drawing Sheets

(51) Int. Cl.
   *G10K 11/172* (2006.01)
   *H01F 27/02* (2006.01)
   *H01F 27/06* (2006.01)

(56) References Cited

U.S. PATENT DOCUMENTS

| | | | |
|---|---|---|---|
| 4,085,395 A * | 4/1978 | Billerbeck | H01F 27/06 336/61 |
| 4,371,858 A * | 2/1983 | Kanoi | H01F 27/33 188/380 |
| 4,442,419 A * | 4/1984 | Kanoi | H01F 27/33 181/208 |
| 4,492,314 A * | 1/1985 | Avery | H01F 27/02 220/646 |
| 4,514,714 A * | 4/1985 | Kanoi | H01F 27/33 181/208 |
| 5,184,104 A * | 2/1993 | Kondo | H01F 27/33 181/294 |
| 2005/0081538 A1* | 4/2005 | Pleva | H01F 6/04 62/50.7 |
| 2011/0147115 A1* | 6/2011 | Ertl | H02K 5/24 181/290 |
| 2016/0133382 A1* | 5/2016 | Sugiyama | H01F 27/02 336/90 |

FOREIGN PATENT DOCUMENTS

| | | |
|---|---|---|
| KR | 10-2001-0010290 A | 2/2001 |
| KR | 10-2009-0033304 A | 4/2009 |
| KR | 10-2009-0070913 A | 7/2009 |
| KR | 10-2010-0115462 A | 10/2010 |

\* cited by examiner

| -10% | CENTER FREQUENCY | 10% | COLOR CLASSIFICATION |
|---|---|---|---|
| 108 | 120 | 132 | ///////// |
| 216 | 240 | 264 | ///////// |
| 324 | 360 | 396 | \\\\\\\\\ |
| 432 | 480 | 528 | \\\\\\\\\ |

FIG. 4

|        | Brace_1 | Brace_2 | Brace_3 | Brace_4 | Brace_5 | Brace_6 | Brace_7 | Brace_8 | Brace_9 | Brace_10 |
|--------|---------|---------|---------|---------|---------|---------|---------|---------|---------|----------|
| LENGTH | 382     | 282     | 282     | 282     | 382     | 382     | 282     | 282     | 282     | 282      |
| WIDTH  | 241     | 241     | 241     | 241     | 241     | 241     | 241     | 241     | 241     | 241      |
| HEIGHT | 2936    | 2222    | 645     | 3961    | 3961    | 1072    | 645     | 645     | 870     | 1456     |
| Mode1  | 58      | 77      | 264     | 43      | 43      | 159     | 264     | 264     | 195     | 117      |
| Mode2  | 116     | 153     | 527     | 86      | 86      | 317     | 527     | 527     | 391     | 234      |
| Mode3  | 174     | 230     | 791     | 129     | 129     | 476     | 791     | 791     | 586     | 350      |
| Mode4  | 232     | 306     | 1054    | 172     | 173     | 634     | 1054    | 1054    | 781     | 467      |
| Mode5  | 290     | 388     | 1316    | 215     | 215     | 793     | 1316    | 1316    | 976     | 584      |
| Mode6  | 347     | 459     | 1576    | 258     | 258     | 951     | 1576    | 1576    | 1171    | 700      |

FIG. 5

| HEIGHT | Mode1 | Mode2 | Mode3 | Mode4 | Mode5 | Mode6 |
|---|---|---|---|---|---|---|
| 100 | 1695 | 3394 | 5112 | 6773 | 8467 | 10093 |
| 200 | 848 | 1699 | 2556 | 3389 | 4239 | 5053 |
| 300 | 566 | 1134 | 1704 | 2260 | 2828 | 3372 |
| 400 | 424 | 851 | 1278 | 1696 | 2123 | 2530 |
| 500 | 340 | 681 | 1022 | 1357 | 1699 | 2025 |
| 600 | 283 | 568 | 852 | 1131 | 1416 | 1688 |
| 700 | 243 | 487 | 730 | 969 | 1214 | 1447 |
| 800 | 212 | 426 | 639 | 848 | 1063 | 1267 |
| 900 | 189 | 379 | 568 | 754 | 945 | 1126 |
| 1000 | 170 | 341 | 511 | 679 | 851 | 1014 |
| 1100 | 154 | 310 | 465 | 617 | 773 | 922 |
| 1200 | 142 | 284 | 426 | 566 | 709 | 845 |
| 1300 | 131 | 262 | 393 | 522 | 655 | 780 |
| 1400 | 121 | 244 | 365 | 485 | 608 | 725 |
| 1500 | 113 | 227 | 341 | 453 | 568 | 676 |
| 1600 | 106 | 213 | 319 | 424 | 532 | 634 |
| 1700 | 100 | 201 | 301 | 400 | 501 | 597 |
| 1800 | 94 | 190 | 284 | 377 | 473 | 564 |
| 1900 | 89 | 180 | 269 | 358 | 448 | 534 |
| 2000 | 85 | 171 | 256 | 340 | 426 | 508 |
| 2100 | 81 | 163 | 243 | 324 | 406 | 484 |
| 2200 | 77 | 155 | 232 | 309 | 387 | 462 |
| 2300 | 74 | 148 | 222 | 295 | 370 | 442 |
| 2400 | 71 | 142 | 213 | 283 | 355 | 423 |
| 2500 | 68 | 137 | 204 | 272 | 341 | 406 |
| 2600 | 65 | 131 | 197 | 261 | 328 | 391 |
| 2700 | 63 | 127 | 189 | 252 | 316 | 376 |
| 2800 | 61 | 122 | 183 | 243 | 304 | 363 |
| 2900 | 59 | 118 | 176 | 234 | 294 | 350 |
| 3000 | 57 | 114 | 170 | 227 | 284 | 339 |
| 3100 | 55 | 110 | 165 | 219 | 275 | 328 |
| 3200 | 53 | 107 | 160 | 212 | 266 | 318 |
| 3300 | 52 | 104 | 155 | 206 | 258 | 308 |
| 3400 | 50 | 101 | 150 | 200 | 251 | 299 |
| 3500 | 49 | 98 | 146 | 194 | 244 | 290 |
| 3600 | 47 | 95 | 142 | 189 | 237 | 282 |
| 3700 | 46 | 92 | 138 | 184 | 230 | 275 |
| 3800 | 45 | 90 | 135 | 179 | 224 | 268 |
| 3900 | 44 | 88 | 131 | 174 | 219 | 261 |
| 4000 | 43 | 85 | 128 | 170 | 213 | 254 |

FIG. 7

BRACE APPARATUS FOR TRANSFORMER TANK AND METHOD FOR DETERMINING LENGTH THEREOF

TECHNICAL FIELD

The present invention relates to a transformer, and more particularly to a brace apparatus for a transformer tank that prevents the occurrence of resonance-based noise in a brace installed at the outer surface of the transformer tank due vibration generated in the transformer tank and a method of determining the length thereof.

BACKGROUND ART

Principal components, such as a core, are installed in a transformer tank, which constitutes the external appearance of a transformer. In order to increase dielectric strength, the interior of the transformer tank is filled with insulating oil. Vibration is generated in the transformer tank during the operation of the transformer, and this vibration is transmitted to the transformer tank via the insulating oil.

The transformer tank is manufactured so as to have a predetermined strength. In order to reinforce the strength of the transformer tank, there is the case in which a brace is installed on the outer surface of the transformer tank. In the case in which the brace is installed at the outer surface of the transformer tank, resistance to pressure is satisfied; however, resonance is generated in a space formed in the brace due to vibration generated in the transformer tank, whereby noise increases.

DISCLOSURE

Technical Problem

The present invention has been made in view of the above problems, and it is an object of the present invention to prevent the occurrence of resonance in a brace apparatus for a transformer tank due to vibration generated in the transformer tank.

Technical Solution

In accordance with an aspect of the present invention, the above and other objects can be accomplished by the provision of a brace apparatus for a transformer tank, the brace apparatus mounted to the outer surface of the transformer tank, wherein the brace apparatus is configured to have a length at which a vibration frequency due to vibration of the transformer tank and a resonant frequency due to resonance generated in a brace main body by the vibration of the transformer tank are in discord with each other, thereby preventing the occurrence of resonance in the brace main body due to the vibration of the transformer tank.

In accordance with another aspect of the present invention, there is provided a brace apparatus for a transformer tank, the brace apparatus mounted to the outer surface of the transformer tank, wherein, in the case in which the brace apparatus has a length greater or less than a length at which a vibration frequency due to vibration of the transformer tank and a resonant frequency due to resonance generated in a brace main body by the vibration of the transformer tank are in discord with each other, at least one partition plate is installed in the brace main body such that the vibration frequency and the resonant frequency are in discord with each other, and the interior of the brace main body is partitioned by the partition plate, thereby preventing the occurrence of resonance in the brace main body due to the vibration of the transformer tank.

The position and number of the partition plate may be determined such that the occurrence of resonance is prevented due to discordance between the vibration frequency and the resonant frequency in an inner space of the brace main body partitioned by the partition plate.

The cross section of the brace main body may have a "[" shape.

In accordance with a further aspect of the present invention, there is provided a method of determining the length of a brace apparatus for a transformer tank, the method being performed to determine the length of a brace main body mounted to the outer surface of the transformer tank, the brace main body having an inner space defined therein, the method including a frequency calculation step of calculating a resonant frequency generated in the brace main body due to the vibration of the transformer tank in each of a plurality of modes in which a vibration frequency due to the vibration of the transformer tank is set differently, a regression equation calculation step of performing regression analysis on the resonant frequency calculated at the frequency calculation step as a resonant frequency for the length of the brace main body in order to calculate a regression equation in each of the modes, a per-length frequency calculation step of calculating the resonant frequency for the length of the brace main body per length obtained by dividing the length of the brace main body by a predetermined interval using the regression equation calculated in each of the modes, and a brace main body length calculation step of calculating the length of the brace main body at which the occurrence of resonance is prevented due to discordance between the vibration frequency of the transformer tank and the resonant frequency in the brace main body based on a resonant frequency calculated per length divided by the interval at the per-length frequency calculation step.

The method may further include a partition plate use determination step of calculating a length at which no resonance is generated in each of the modes from the length of the brace main body calculated at the brace main body length calculation step and determining whether to use a partition plate using the calculated length.

The position and number of the partition plate may be determined such that the occurrence of resonance is prevented due to the discordance between the vibration frequency and the resonant frequency in an inner space of the brace main body partitioned by the partition plate.

Advantageous Effects

A brace apparatus for a transformer tank according to the present invention may be expected to have the following effects.

In the present invention, the length of the brace apparatus, which is attached to the outer surface of the transformer tank in order to reinforce the strength of the transformer tank, is set to a length at which it is possible to prevent the occurrence of resonance in a brace due to vibration transmitted from the transformer tank, or a partition plate is installed in the brace such that the interior of the brace is divided into lengths at which no resonance is generated. In the present invention, therefore, it is possible to prevent the occurrence of resonance by setting the length of the brace or the number of partition plates installed in the brace in a transformer tank having various sizes, whereby it is possible to minimize noise generated in the brace of the transformer tank.

DESCRIPTION OF DRAWINGS

FIG. 4 is a table showing the classification of frequency ranges within which a transformer tank known to vibrate at a given resonant frequency has a possibility of resonating in the present invention;

FIG. 5 is a table showing frequencies calculated from brace main bodies having different lengths in various modes and modes in which resonance is generated;

FIG. 7 is a table showing modes in which resonance is generated depending on the length of the brace main body, which are calculated from a regression equation at a predetermined length interval, in the present invention.

BEST MODE

Hereinafter, some embodiments of the present invention will be described with reference to the illustrative drawings. In describing the embodiments of the present invention, a detailed description of known functions and configurations incorporated herein will be omitted when it is determined that inclusion of the same would impede understanding of the embodiments of the present invention.

Figure 1:
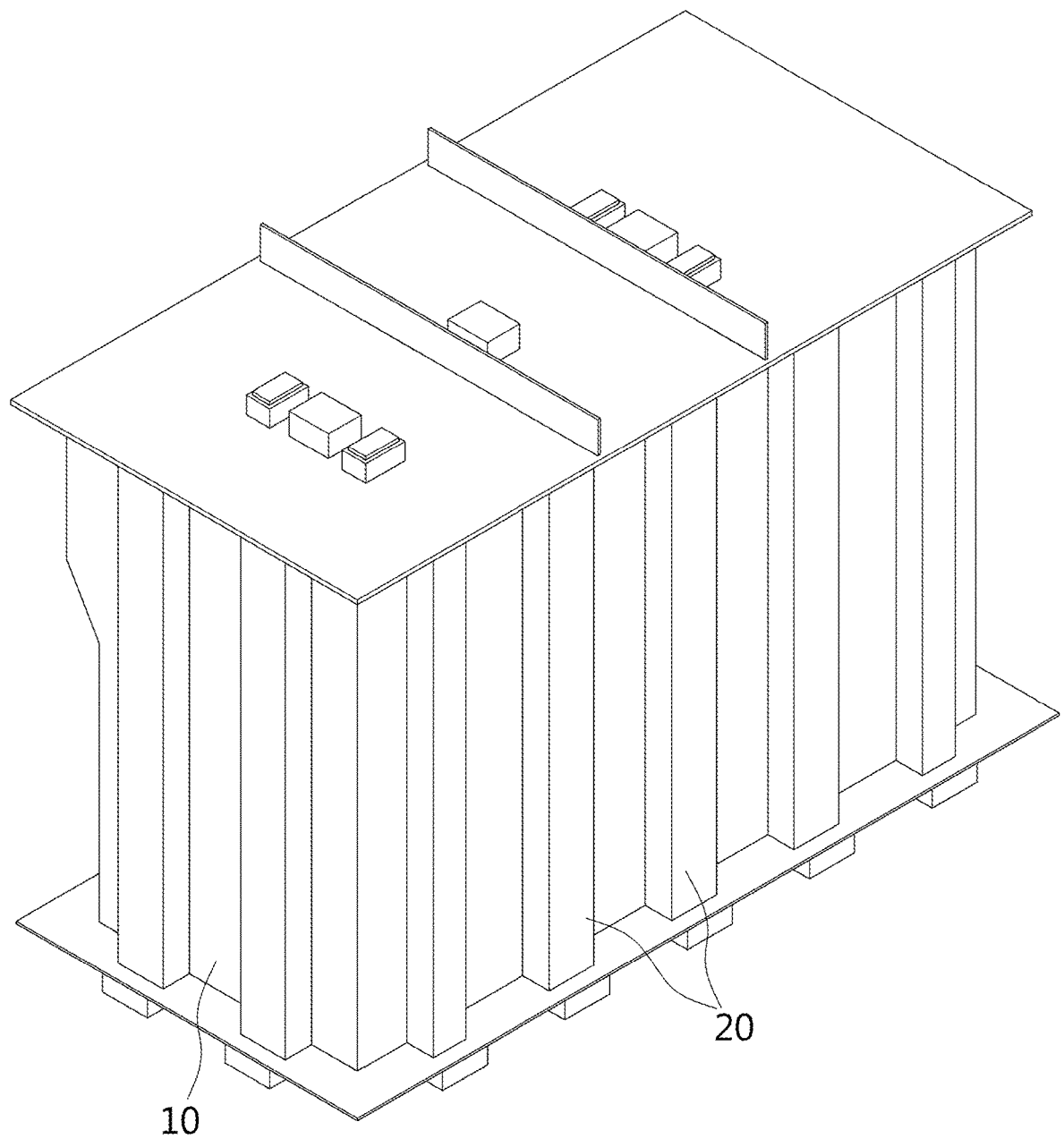
FIG. 1 is a schematic perspective view showing the general structure of a transformer tank, on the outer surface of which a brace apparatus is installed.
Figure 2:
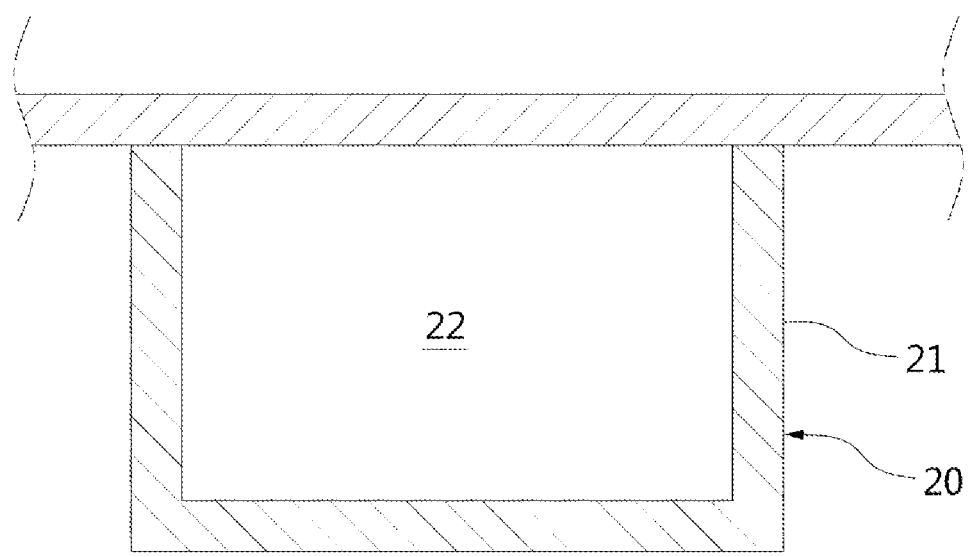
FIG. 2 is a partial sectional view showing the state in which the brace apparatus shown in FIG. 1 is installed at the transformer tank.
Figure 3:
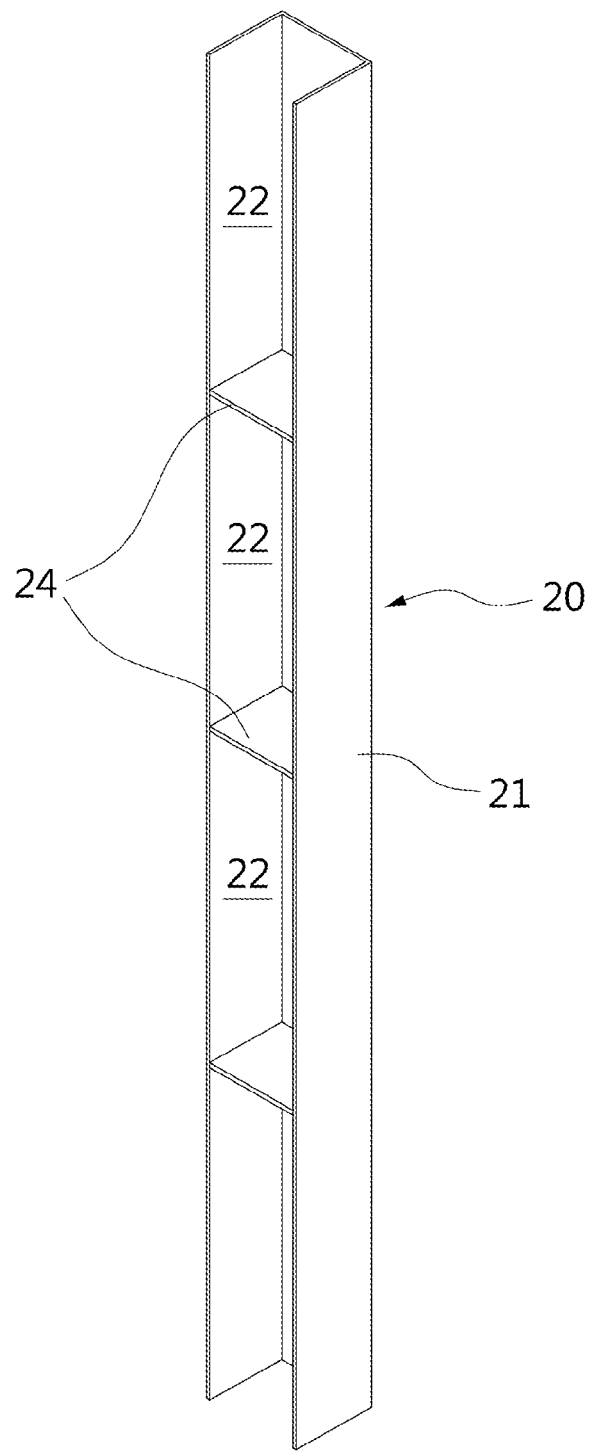
FIG. 3 is a perspective view showing an example of a brace apparatus according to an embodiment of the present invention.

Referring to the drawings, a brace apparatus 20 is installed at the outer surface of a general transformer tank 10. A brace main body 21 forms the framework of the brace apparatus 20. In the present embodiment, the cross section of the brace main body 21 is configured in a "[" shape. Consequently, an inner space 22 of the brace main body 21 is open at one side and opposite ends of the brace main body 21. In the case in which the brace main body 21 is attached to the outer surface of the transformer tank 10, as shown in FIG. 2, the inner space 22 is closed except for opposite ends of the brace main body. Of course, the opposite ends of the brace main body 21 may also be closed by other constructions.

In principle, the length of the brace main body 21 (the height in the drawings) is determined depending on the height of the transformer tank 10 or the presence of a structure provided on the outer surface of the transformer tank 10. In the case in which the length of the brace main body 21, determined due to the structural characteristics thereof, as described above, does not generate resonance in the inner space 22, the length of the brace main body 21 may be used without change. In the case in which the determined length of the brace main body 21 has a value at which resonance is generated in the inner space 22, however, partition plates 24 are installed in the brace main body in order to prevent the occurrence of resonance.

The partition plates 24 partition the inner space 22. Substantially, the partition plates are installed in the brace main body 21 so as to be spaced apart from each other by a predetermined distance in order to reinforce the strength of the brace main body 21 and at the same time to prevent the occurrence of resonance.

In the present invention, the length of the brace main body 21 is set to a value at which resonance is not generated such that the brace main body is attached to the outer surface of the transformer tank 10. Alternatively, the installation position and number of partition plates 24 are determined in order to prevent resonance from being generated in the brace main body 21 using the partition plates 24.

To this end, for a brace main body 21 having a specific specification, resonant frequencies generated in the brace main body 21 due to vibration are calculated in a plurality of modes in which the vibration frequency due to the vibration generated in the transformer tank 10 is set differently. At this time, the resonant frequencies may be calculated, for example, using the commercial program entitled Virtual.lab. In the case in which the resonant frequency in each mode, calculated as described above, coincides with the vibration frequency or is within the range of ±10% of the vibration frequency, it is considered that there is a possibility of resonance.

Next, resonant frequencies in the plurality of modes are calculated while the length of the brace main body 21 is changed in the state in which the other conditions are the same. The reason for this is that, since resonance may occur depending on the length of the brace main body 21 even in the case in which the vibration frequency of the transformer tank 10 is uniform, the resonant frequency in each mode is calculated while the length of the brace main body is changed in order to find the length of the brace main body at which no resonance is generated.

A regression equation is derived using the resonant frequency in each mode calculated for each length of the brace main body 21, as described above. That is, a regression equation is derived from a curve that appears in each mode, in which the horizontal axis indicates the length of the brace main body 21 and the vertical axis indicates the frequency.

As a result, a regression equation is derived for each mode, and the length value of the brace main body 21 is substituted into the regression equation to calculate the resonant frequency in each mode for each length of the brace main body 21 (at a predetermined interval). Here, the length interval of the brace main body 21 is uniform, and the resonant frequency is calculated in each mode for each length of the brace main body 21.

Next, in the case in which, when the resonant frequency is calculated using the regression equation for each length of the brace main body 21 at the uniform length interval, the vibration is within the range of ±10% of the vibration frequency, it is regarded that there is a possibility of resonance, and the length of the brace main body 21 at which there is no possibility of resonance in any mode is calculated.

In the case in which the specification of the transformer tank 10 is set and then the length of the brace main body 21 to be applied thereto is set, it is determined whether this length is a length at which there is no possibility of resonance in any mode. Upon determining that the length of the brace main body 21 to be applied is a length at which there is no possibility of resonance in any mode, the brace main body 21 having the length is used as it is. That is, the brace main body 21 having the length of the brace main body 21 to be applied is used as it is without installing separate partition plates 24 therein.

Upon determining that the length of the brace main body 21 to be applied to the transformer tank 10 is a length at which there is a possibility of resonance even in any one of the modes, however, the partition plates 24 are applied. At this time, the partition plates 24 are installed at positions obtained by dividing the length of the brace main body 21 to be applied by a length at which resonance is not generated.

For easier understanding of the above description, hereinafter, an actual example in which the length of the brace main body 21 is set or the position and number of the partition plates 24 are set will be described.

First, it is assumed that the vibration frequency due to the vibration given from the transformer tank 10 is 120 Hz, and the range of the resonant frequency at which resonance can be generated in relation to the vibration frequency is calculated as shown in the table of FIG. 4.

That is, it is regarded that there is a possibility of resonance due to coincidence between the vibration frequency and the resonant frequency between 108 and 132 Hz, which is the range of ±10% of 120 Hz, between 216 and 264 Hz, which is the range of ±10% of 240 Hz, between 324 and 396 Hz, which is the range of ±10% of 360 Hz, and between 432 and 528 Hz, which is the range of ±10% of 480 Hz. In the table of FIG. 4, different colors indicate the respective frequency ranges in order to classify the frequency ranges.

Next, resonant frequencies were calculated for brace main bodies 21 having a length of 382 mm, a width of 241 mm, and various lengths (heights). At this time, modes were classified into mode 1 to mode 6. The modes may be classified by differently set vibration frequencies.

In the above conditions, the resonant frequency in each mode was calculated using a commercial program entitled Virtual.lab for a specific brace main body 21. The resonant frequencies, calculated as described above, are shown in the table of FIG. 5. The color of each field shown in FIG. 5 indicates whether the resonant frequency in each mode is included within the ranges classified in FIG. 4.

Figure 6:
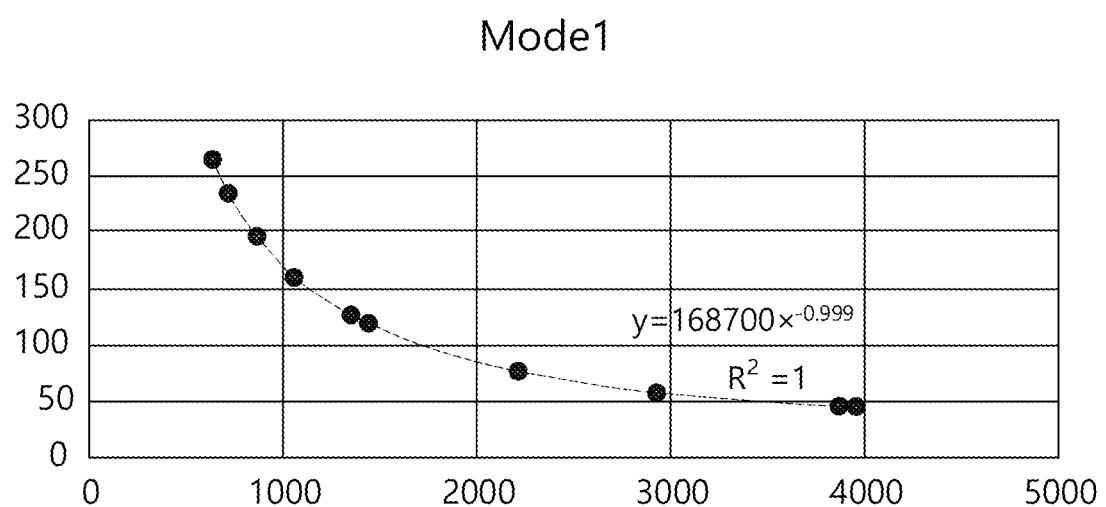
FIG. 6 is a graph showing a regression equation calculated between the length of the brace main body and a frequency.

Next, as shown in FIG. 6, a graph, in which the x axis indicates the length of the brace main body 21 and the y axis indicates the resonant frequency, was made using the resonant frequencies shown in the table of FIG. 5. It is possible to obtain the resonant frequency of the brace main body 21 at a uniform length interval from the curve of this graph. That is, it is possible to calculate a regression equation for a corresponding mode. The resonant frequencies obtained as described above are shown in FIG. 7. Here, the resonant frequencies were calculated for a total of 6 modes. To this end, the regression equation must be calculated for each mode.

In the table of FIG. 7, the resonant frequency in each mode was shown for each length (height) of the brace main body 21, and whether these resonant frequencies are within the ranges within which resonance at the vibration frequency is possible is shown using the same colors as in FIG. 4.

Next, once the length of the brace main body 21 to be applied is set, it is determined whether this length is a length at which there is no possibility of resonance in any mode with reference to FIG. 7. Upon determining that the length of the brace main body 21 to be applied is a length at which there is no possibility of resonance in any mode, the brace main body 21 having the above length is used as it is. Upon determining that the length of the brace main body 21 to be applied to the transformer tank 10 is a length at which there is a possibility of resonance even in any one of the modes, however, the partition plates 24 are applied. At this time, the partition plates 24 are installed at positions obtained by dividing the length of the brace main body 21 to be applied by a length at which resonance is not generated. That is, one or more partition plates 24 are installed in an inner space of the brace main body 21 so as to provide the length by which the vibration frequency of the transformer tank 10 and the resonant frequency in the brace main body 21 do not coincide with each other. At this time, discordance between the vibration frequency and the resonant frequency means that the resonant frequency deviates from a predetermined range based on the vibration frequency (in the present invention, the range of ±10% of the vibration frequency).

For example, in the case in which the length of the brace main body 21 to be applied is 1700 mm, the resonant frequency in mode 5 is 501 Hz, which is within a resonance generation range, with reference to the table of FIG. 7. Consequently, 1700 mm cannot be used as it is. Since no resonance is generated at 100, 200, 300, 400, 600, 800, 1200, and 1600 mm with reference to the table of FIG. 7, the partition plates 24 may be installed as follows.

That is, 1700 may be divided into 1600 and 100 mm, and thus a single partition plate 24 may be installed at a position corresponding to 1600 mm. Alternatively, 1700 may be divided into 1200, 600, and 100 mm, and thus two partition plates 24 may be installed at positions corresponding to 1200 mm and 600 mm. In this case, 16 partition plates 24 may be installed at an interval of 100 mm. In this way, the number and position of the partition plates 24 are set.

In the case in which the vibration frequency of the transformer tank 10 is in discord with the resonant frequencies in all modes in an inner space of a brace main body 21 having a specific length, it is not necessary to install the partition plates 24. Referring to FIG. 7, there are 3200, 1600, 1200, 800, 600, 400, 300, 200, and 100 mm as lengths shown using blue color.

The above description has been made merely to illustrate the technical idea of the present invention, and those skilled in the art to which the present invention pertains will appreciate that various variations and modifications are possible without departing from the intrinsic features of the present invention. Therefore, the embodiments disclosed in this specification are provided to describe the technical idea of the present invention, rather than to limit the technical idea of the present invention, and the scope of the present invention is not limited by the embodiments. The scope of protection of the present invention should be determined by the appended claims, and all technical ideas within the range equivalent to the appended claims should be understood to fall within the scope of rights of the present invention.

The invention claimed is:

1. A method of determining a length of a brace apparatus for a transformer tank, the method being performed to determine a length of a brace main body mounted to an outer surface of the transformer tank, the brace main body having an inner space defined therein, the method comprising:

a frequency calculation step of calculating a resonant frequency generated in the brace main body due to vibration of the transformer tank in each of a plurality of modes in which a vibration frequency due to the vibration of the transformer tank is set differently;

a regression equation calculation step of performing regression analysis on the resonant frequency calculated at the frequency calculation step as a resonant frequency for the length of the brace main body in order to calculate a regression equation in each of the modes;

a per-length frequency calculation step of calculating the resonant frequency for the length of the brace main body per length obtained by dividing the length of the brace main body by a predetermined interval using the regression equation calculated in each of the modes;

a brace main body length calculation step of calculating a length of the brace main body at which occurrence of resonance is prevented due to discordance between the vibration frequency of the transformer tank and the resonant frequency in the brace main body based on a resonant frequency calculated per length divided by the interval at the per-length frequency calculation step; and a partition plate use determination step of calculating a length at which no resonance is generated in each of the modes from the length of the brace main body calculated at the brace main body length calculation step and determining whether to use a partition plate using the calculated length.

2. The method according to claim 1, wherein a position and number of the partition plate are determined such that the occurrence of resonance is prevented due to the discordance between the vibration frequency and the resonant frequency in an inner space of the brace main body partitioned by the partition plate.

\* \* \* \* \*